(12) United States Patent
Zhang et al.

(10) Patent No.: US 12,183,841 B2
(45) Date of Patent: Dec. 31, 2024

(54) SOLAR CELL AND MANUFACTURING METHOD THEREOF, AND PHOTOVOLTAIC MODULE

(71) Applicant: ZHEJIANG JINKO SOLAR CO., LTD., Zhejiang (CN)

(72) Inventors: Bike Zhang, Haining (CN); Mengwei Xu, Haining (CN); Jingsheng Jin, Haining (CN); Xinyu Zhang, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/365,170

(22) Filed: Aug. 3, 2023

(65) Prior Publication Data
US 2024/0282877 A1 Aug. 22, 2024

(30) Foreign Application Priority Data
Feb. 22, 2023 (CN) .......................... 202310172661.1

(51) Int. Cl.
*H01L 31/05* (2014.01)
*H01L 31/0224* (2006.01)
(Continued)

(52) U.S. Cl.
CPC .. *H01L 31/0512* (2013.01); *H01L 31/022425* (2013.01); *H01L 31/035209* (2013.01); *H01L 31/1868* (2013.01)

(58) Field of Classification Search
CPC ..... H01L 31/022425; H01L 31/035209; H01L 31/0512; H01L 31/0747
See application file for complete search history.

(56) References Cited

U.S. PATENT DOCUMENTS 9,564,542 B2 * 2/2017 Turner ................ H01L 31/1864
10,658,529 B2 * 5/2020 Ji ........................ H01L 31/1868
(Continued)

FOREIGN PATENT DOCUMENTS

| CN | 209232797 U | 8/2019 |
|----|-------------|--------|
| CN | 210897294 U | 6/2020 |

(Continued)

OTHER PUBLICATIONS

European Search Report issued in corresponding EP Application 23189628.3, issued Jan. 4, 2024, 7 pages.
(Continued)

*Primary Examiner* — Golam Mowla
(74) *Attorney, Agent, or Firm* — W&G Law Group

(57) ABSTRACT

A solar cell, a manufacturing method thereof, and a photovoltaic module. The solar cell includes: a semiconductor substrate including first and second surfaces opposite to each other; emitter and first passivation layer formed over the first surface; tunneling layer formed over the second surface; first doped conductive layer and retardation layer formed on the tunneling layer and corresponding to metallization region, the first doped conductive layer is located between the tunneling layer and the retardation layer; second doped conductive layer formed over the tunneling layer and covering the tunneling layer in non-metallization region and the retardation layer, the retardation layer is configured to retard migration of doped element in the second doped conductive layer to the first doped conductive layer; second passivation layer formed over the second doped conductive layer; and second electrode forming contact with the second doped conductive layer and first electrode forming contact with the emitter.

18 Claims, 7 Drawing Sheets

(51) Int. Cl.
*H01L 31/0352* (2006.01)
*H01L 31/18* (2006.01)

(56) References Cited

U.S. PATENT DOCUMENTS

| | | | |
|---|---|---|---|
| 11,114,575 B1 | 9/2021 | Jin et al. | |
| 11,257,974 B2 * | 2/2022 | Löper | H01L 31/0747 |
| 2018/0138331 A1 * | 5/2018 | Lee | H01L 31/022441 |
| 2019/0326456 A1 * | 10/2019 | Ha | H01L 31/1864 |
| 2021/0217907 A1 | 7/2021 | Chen et al. | |
| 2022/0140160 A1 | 5/2022 | Jin et al. | |

FOREIGN PATENT DOCUMENTS

| | | | | |
|---|---|---|---|---|
| CN | 112331742 A | | 2/2021 | |
| CN | 112349798 A | | 2/2021 | |
| CN | 112466961 A | | 3/2021 | |
| CN | 112736159 A | | 4/2021 | |
| CN | 213519984 U | | 6/2021 | |
| CN | 114038928 A | | 2/2022 | |
| CN | 114709277 A | | 7/2022 | |
| CN | 114899243 A | | 8/2022 | |
| CN | 115172477 A | * | 10/2022 | ..... H01L 31/022441 |
| CN | 115274875 A | | 11/2022 | |
| CN | 115411151 A | | 11/2022 | |
| CN | 115411152 A | | 11/2022 | |
| CN | 115458617 A | | 12/2022 | |
| DE | 102008055036 A1 | | 7/2010 | |
| EP | 2797124 A1 | | 10/2014 | |
| EP | 2988336 A2 | | 2/2016 | |
| JP | 2010171263 A | | 8/2010 | |
| JP | 2022058069 A | | 4/2022 | |
| JP | 2022073810 A | | 5/2022 | |
| JP | 7427833 B1 | | 2/2024 | |
| KR | 20150029203 A | | 3/2015 | |
| KR | 20160097922 A | | 8/2016 | |
| KR | 20170143074 A | | 12/2017 | |
| KR | 20180018895 A | | 2/2018 | |

OTHER PUBLICATIONS

Notice Of Allowance(CN202310172661.1); Date of Mailing: May 17, 2023.
First Office Action(CN202310172661.1); Date of Mailing: Apr. 25, 2023.
Effect-of-polysilicon-layer-doping-concentration-on-passivation-contact-effect Mechanical translation.
First Office Action(JP2023-105399); Date of Mailing: Sep. 27, 2023.
Australian Office Action for Application No. 2023210662, mailed Jun. 4, 2024 (6 pages).
Korean Grant of Patent for Application No. 10-2023-0087294, mailed Sep. 23, 2024,( 7 pages).

* cited by examiner

SOLAR CELL AND MANUFACTURING METHOD THEREOF, AND PHOTOVOLTAIC MODULE

CROSS-REFERENCE TO RELATED APPLICATIONS

The present disclosure claims priority to Chinese Patent Application No. 202310172661.1, filed on Feb. 22, 2023, the content of which is incorporated by reference in its entirety.

TECHNICAL FIELD

The present disclosure relates to the technical field of photovoltaic cells and, in particular, to a solar cell and a manufacturing method thereof, and a photovoltaic module.

BACKGROUND

With continuous development of the solar cell technologies, the recombination loss in a metal contact region has become one of the most significant constraint factors in improvement of solar cell conversion efficiency. To improve a conversion rate of a solar cell, passivation is generally conducted on the solar cell =by passivated contact, so as to reduce recombinations inside and on surfaces of the solar cell. Common passivated contact solar cells are Heterojunction with Intrinsic Thin-layer (HIT) solar cells and Tunnel Oxide Passivated Contact (TOPCon) solar cells. However, there is limited improvement in passivation performance of the passivation structure of the existing solar cell, so that conversion efficiency of the passivated contact solar cell needs to be improved, and thus difficult in mass production.

Therefore, how to improve the passivation performance of the passivated contact solar cell has become an urgent problem to be solved in the photovoltaic industry.

SUMMARY

In view of the above, the present disclosure proposes a solar cell, a method for solar cell, and a photovoltaic module. The solar cell can ensure lateral transport capabilities of carriers while improving low passivation performance of a metallization region.

In a first aspect, one or more embodiments of the present disclosure provide a solar cell, the solar cell includes: a semiconductor substrate, the semiconductor substrate including a first surface and a second surface arranged opposite to each other; an emitter and a first passivation layer formed over the first surface of the semiconductor substrate; a tunneling layer formed over the second surface of the semiconductor substrate; a first doped conductive layer and a retardation layer formed on a surface of the tunneling layer, the first doped conductive layer is located between the tunneling layer and the retardation layer, and the first doped conductive layer and the retardation layer correspond to a metallization region; a second doped conductive layer formed over the surface of the tunneling layer, the second doped conductive layer covering the tunneling layer in a non-metallization region and the retardation layer, the retardation layer is configured to retard migration of a doped element in the second doped conductive layer to the first doped conductive layer; a second passivation layer formed over a surface of the second doped conductive layer; and a second electrode penetrating through the second passivation layer to form contact with the second doped conductive layer and a first electrode penetrating through the first passivation layer to form contact with the emitter.

In a second aspect, one or more embodiments of the present disclosure provide a method for manufacturing solar cell, including: providing a semiconductor substrate, the semiconductor substrate including a first surface and a second surface arranged opposite to each other; forming an emitter on the first surface of the semiconductor substrate after texturing; forming a tunneling layer over the second surface of the semiconductor substrate; forming a first non-conductive layer on a surface of the tunneling layer, the first non-conductive layer corresponding to a metallization region and a non-metallization region; forming a retardation layer over a surface of the first non-conductive layer, the retardation layer corresponding to the metallization region; forming a second non-conductive layer over surfaces of the first non-conductive layer and the retardation layer, and doping the second non-conductive layer so that the second non-conductive layer and the first non-conductive layer that is located in the non-metallization region are transformed into a second doped conductive layer, and the first non-conductive layer located in the metallization region is transformed into a first doped conductive layer, a doping concentration of the second doped conductive layer is greater than a doping concentration of the first doped conductive layer; forming a second passivation layer over a surface of the second doped conductive layer and forming a first passivation layer over a surface of the emitter; and forming a second electrode on a surface of the second passivation layer and forming a first electrode on a surface of the first passivation layer.

In a third aspect, one or more embodiments of the present disclosure provide a photovoltaic module, the photovoltaic module includes a cover plate, a packaging material layer, and at least one solar cell string including a plurality of solar cells according to the first aspect or manufactured with the manufacturing method according to the second aspect.

BRIEF DESCRIPTION OF DRAWINGS

In order to better illustrate the technical solutions in embodiments of the present disclosure or the related art, the accompanying drawings to be used in the description of the embodiments or the related art will be introduced below. It is apparent that, the accompanying drawings in the following description are only some embodiments of the present disclosure, and other drawings can be obtained by those of ordinary skill in the art from the provided drawings without creative efforts.

DESCRIPTION OF EMBODIMENTS

Figure 1:
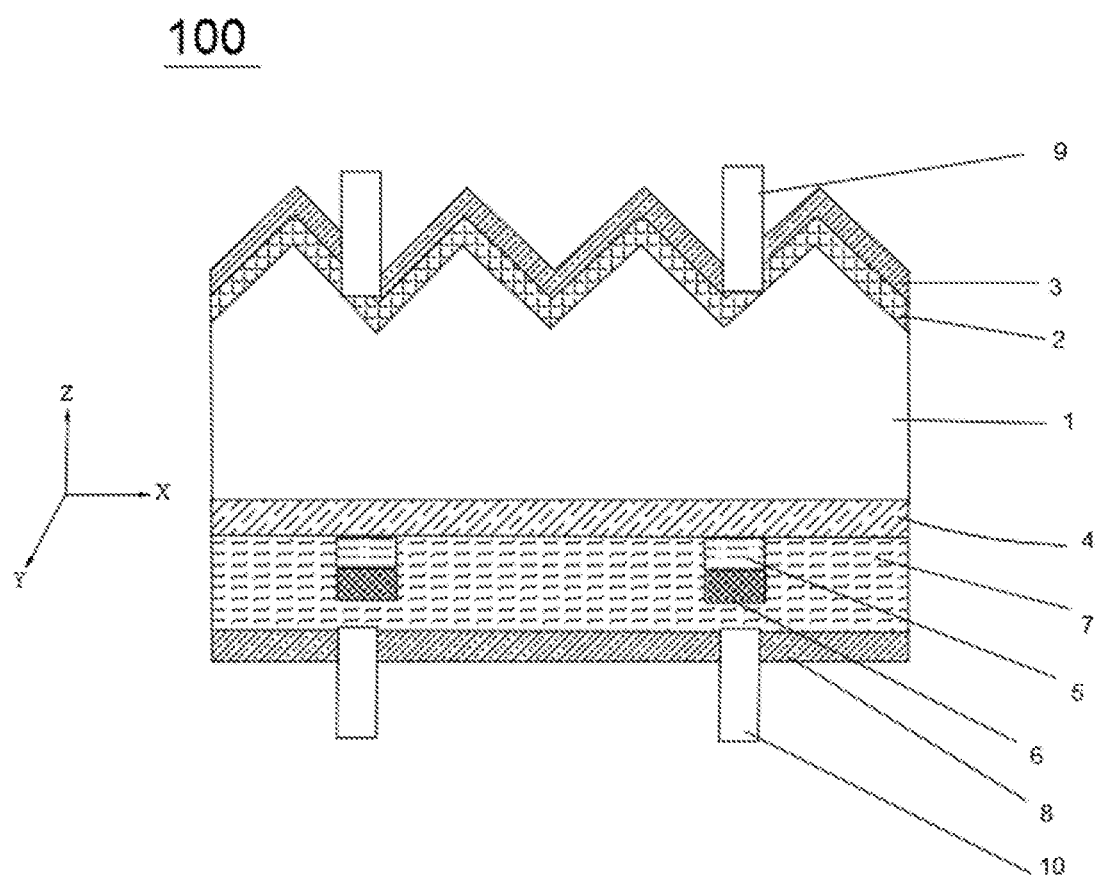
FIG. 1 is a schematic structural diagram of a solar cell according to one or more embodiments of the present disclosure.

In order to better understand the technical solutions of the present disclosure, embodiments of the present disclosure will be described in detail below in conjunction with the accompanying drawings.

It should be clear that the described embodiments are merely some of rather than all of the embodiments of the present disclosure. Based on the embodiments in the present disclosure, all other embodiments obtained by those of ordinary skill in the art without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are also intended to include plural forms, unless otherwise clearly indicated in the context.

It should be understood that the term "and/or" used herein describes an association relationship between associated objects and represents that three relationships may exist. For example, A and/or B may represent the following three cases: only A exists, both A and B exist, and only B exists. In addition, the character "/" herein generally indicates an "or" relationship between the associated objects.

Optimizing surface passivation of crystalline silicon solar cell is one of the important manners to improve the efficiency. In recent years, with the development of a theoretical technology and people's demand on better passivation effect, a TOPCon structure is widely favored due to higher theoretical efficiency thereof. The TOPCon structure includes ultra-thin silicon oxide and a heavily doped silicon film, which performs good field passivation effect, so that efficiency of a crystalline silicon solar cell manufactured using TOPCon technology has reached more than 26%.

Most existing TOPCon solar cells use polysilicon (poly-Si) as a doped layer. A layer of amorphous silicon (a-Si:H) is first deposited by chemical vapor deposition (CVD) and then annealed to transform a-Si:H into poly-Si, which greatly improves the crystallinity, and poly-Si are further doped and activated to improve conductivity of the TOPCon solar cells. Researchers have found that a quasi-Fermi level difference qVD between a silicon substrate and a collection layer is a physical quantity that determines an upper limit of an open-circuit voltage. When qVD is larger, the upper limit of the open-circuit voltage Voc of the solar cell is also higher. Doping concentration of a conventional doped polysilicon layer is required to reach a certain height, so as to form good contact with a metal electrode. However, a polysilicon layer with high doping concentration may have two problems: phosphorus diffusion to an oxide layer may adversely affect the passivation effect of a tunneling layer; and qVD between doped polysilicon and the silicon substrate is small, resulting in a low upper limit of a theoretical open-circuit voltage, thereby limiting improvement of conversion efficiency of the TOPCon solar cell.

In view of this, embodiments of the present disclosure provide a solar cell. FIG. 1 shows a schematic structural diagram of a solar cell according to some embodiments of the present disclosure, the solar cell includes: a semiconductor substrate 1, an emitter 2, a first passivation layer 3, a tunneling layer 4, a first doped conductive layer 5, a retardation layer 6, a second doped conductive layer 7, a second passivation layer 8, a first electrode 9, and a second electrode 10. The semiconductor substrate 1 has a first surface and a second surface arranged opposite to each other. The emitter 2 and the first passivation layer 3 are located on the first surface of the semiconductor substrate 1. The tunneling layer 4 is located on the second surface of the semiconductor substrate 1. The first doped conductive layer 5 and the retardation layer 6 are located on a surface of the tunneling layer 4, the first doped conductive layer 5 is located between the tunneling layer 4 and the retardation layer 6, and the first doped conductive layer 5 and the retardation layer 6 correspond to a metallization region. The second doped conductive layer 7 is located on the surface of the tunneling layer 4, the second doped conductive layer 7 covers the tunneling layer 4 in a non-metallization region and the retardation layer 6, and a doping concentration of the second doped conductive layer 7 is greater than a doping concentration of the first doped conductive layer 5. The second passivation layer 8 is located on a surface of the second doped conductive layer 7. The first electrode 9 is in contact with the emitter 2 and a second electrode 10 is in contact with the second doped conductive layer 7.

The first doped conductive layer 5 with low concentration and the retardation layer 6 are arranged only in the metallization region of the second surface of the solar cell, while the second doped conductive layer 7 with higher concentration is arranged on the entire second surface of the solar cell. In this way, on the one hand, the first doped conductive layer 5 with lower concentration is in contact with the tunneling layer 4, which can reduce the passivation effect of the doped element on the tunneling layer 4 and reduce recombination current density $J_{0,metal}$ in the metallization region, and at the same time, a quasi-Fermi level difference qVD between the first doped conductive layer 5 with lower concentration and the semiconductor substrate 1 is smaller, which is conducive to increasing the theoretical open-circuit voltage and thus improving photoelectric conversion efficiency of the solar cell. In addition, the second doped conductive layer 7 with higher concentration exists in the metallization region and the non-metallization region, which can ensure lateral transport rates of carriers on a rear surface of the solar cell. Moreover, the distance between the second doped conductive layer 7 in the non-metallization region and the semiconductor substrate 1 is relatively short, which can prevent excessive weakening of an energy band bending effect of the second doped conductive layer 7 caused by an excessive long distance between the second doped conductive layer 7 and the semiconductor substrate 1 due to the arrangement of the first doped conductive layer 5 with low concentration and the retardation layer 6, thereby ensuring selective transport of the carriers. Compared with the sequential arrangement of an entire surface of a lightly doped conductive layer, an entire surface of the retardation layer 6, and an entire surface of a heavily doped conductive layer on the tunneling layer 4 on the rear surface of the solar cell to improve the passivation effect, the design of localized doped conductive layers in the present disclosure can improve the passivation effect in the metallization region, and also ensure lateral transport efficiency of the carriers, which can effectively improve efficiency of the solar cell.

In some embodiments, the first surface of the semiconductor substrate 1 may be a front surface of the solar cell or the rear surface of the solar cell. When the first surface of the semiconductor substrate 1 is the front surface of the solar cell, the second surface of the semiconductor substrate 1 is the rear surface of the solar cell. When the first surface of the semiconductor substrate 1 is the rear surface of the solar cell, the second surface of the semiconductor substrate 1 is the front surface of the solar cell. It may be understood that the front surface of the solar cell is a surface facing the sun (i.e., a light-receiving surface), and the rear surface of the solar cell is a surface facing away from the sun (i.e., a backlight surface). The following descriptions are all based on examples in which the first surface of the semiconductor substrate 1 is the front surface of the solar cell and the second surface of the semiconductor substrate 1 is the rear surface of the solar cell.

For those skilled in the art, the metallization region refers to a region where the second electrode 10 of the solar cell penetrates through the second passivation layer 8 to form (direct or indirect) contact with the doped conductive layer. In some cases, conductive metal particles during electrode formation may dissociate from the main structure of the electrode to form indirect contact. The non-metallization region refers to regions other than the region where the second electrode 10 penetrates through the second passivation layer 8 and forms contact with the doped conductive layer or a region other than the metallization region.

In some embodiments, the semiconductor substrate 1 is an N-type crystalline silicon substrate (or silicon wafer), or a P-type crystalline silicon substrate (silicon wafer). The crystalline silicon substrate (silicon substrate) is, for example, one of a polycrystalline silicon substrate, a monocrystalline silicon substrate, a microcrystalline silicon substrate, or a silicon carbide substrate. A specific type of the semiconductor substrate 1 is not limited in the embodiments of the present disclosure. A doped element of the semiconductor substrate 1 may be phosphorus, nitrogen, or the like.

In some embodiments, a thickness of the semiconductor substrate 1 ranges from 60 μm to 240 μm, which may be, for example, 60 μm, 80 μm, 90 μm, 100 μm, 120 μm, 150 μm, 200 μm, 240 μm, or the like, which is not limited herein.

In some embodiments, the emitter 2 may have an emitter 2 structure with a uniform doping depth, or have a selective emitter 2 structure with a different doping concentration and a different doping depth. For example, the selective emitter 2 is a heavily doped emitter region corresponding to the metal electrode, and other regions are lightly doped emitter regions. The emitter 2 region may be located within the surface of the semiconductor substrate 1, or located outside the surface of the semiconductor substrate 1 to form an independent emitter 2 structure. When the semiconductor substrate 1 is N-type, the emitter 2 is P-type, and the semiconductor substrate 1 and the emitter 2 form a PN junction.

In some embodiments, the first passivation layer 3 may include, but is not limited to, a single-layer oxide layer or a multi-layer structure such as silicon oxide, silicon nitride, silicon oxynitride, or aluminum oxide. The first passivation layer 3 can produce good passivation effect on the semiconductor substrate 1 and help to improve conversion efficiency of the solar cell. It is to be noted that the first passivation layer 3 may also play a role in reducing reflection of incident light, which, in some examples, may be called as an anti-reflection layer.

In some embodiments, a thickness of the first passivation layer 3 ranges from 10 nm to 120 nm, which may be, for example, 10 nm, 20 nm, 30 nm, 42 nm, 50 nm, 60 nm, 70 nm, 80 nm, 90 nm, 100 nm, 120 nm, or the like, and may be other values in the above range, which is not limited herein.

In some embodiments, the tunneling layer 4 is a thin oxide layer, which may be, for example, silicon oxide or metal oxide, and may include other additional elements, such as nitrogen. For example, the tunneling layer 4 may be a stacked structure of one or more of a silicon oxide layer, an aluminum oxide layer, a silicon oxynitride layer, a molybdenum oxide layer, or a hafnium oxide layer. In some other embodiments, the tunneling layer 4 may be an oxygen-containing silicon nitride layer, an oxygen-containing silicon carbide layer, or the like. The tunneling layer 4 may not have perfect tunneling barrier in practice, due to, for example, defects such as pinholes, which may lead to dominance of other charge carrier transport mechanisms (e.g., drift and diffusion) over the tunneling effect.

In some embodiments, a thickness of the tunneling layer 4 ranges from 0.5 nm to 2 nm, which may be, for example, 0.5 nm, 0.8 nm, 1 nm, 1.2 nm, 1.5 nm, 1.8 nm, 2 nm, or the like. The thinner tunneling layer 4 in the present disclosure helps to prevent transport of majority carriers and promote tunneling collection of minority carriers.

In some embodiments, the first doped conductive layer 5 includes semiconductor materials such as polysilicon, microcrystalline silicon, and silicon carbide. A specific type of the first doped conductive layer 5 is not limited in the embodiments of the present disclosure. For example, the material of the first doped conductive layer 5 includes polysilicon. That is, the first doped conductive layer 5 is a first doped polysilicon layer, and the second doped conductive layer 7 is a second doped polysilicon layer.

In some embodiments, a doped element in the first doped conductive layer 5 includes at least one of boron, phosphorus, gallium, or arsenic.

In some embodiments, the doping concentration of the first doped conductive layer 5 ranges from $1E18$ $cm^{-3}$ to $1.5E21$ $cm^{-3}$, which may be, for example, $1E18$ $cm^{-3}$, $3E18$ $cm^{-3}$, $8E18$ $cm^{-3}$, $1E19$ $cm^{-3}$, $5E19$ $cm^{-3}$, $1E20$ $cm^{-3}$, $5E20$ $cm^{-3}$, $8E20$ $cm^{-3}$, $1E21$ $cm^{-3}$, $1.5E21$ $cm^{-3}$, or the like.

When the doped element in the first doped conductive layer 5 is phosphorus and the material thereof is polysilicon, the first doped conductive layer 5 is a phosphorus-doped polysilicon layer. Concentration of phosphorus in the phosphorus-doped polysilicon layer ranges from $1E19$ $cm^{-3}$ to $1.5E21$ $cm^{-3}$, which may be, for example, $1E19$ $cm^{-3}$, $5E19$ $cm^{-3}$, $1E20$ $cm^{-3}$, $5E20$ $cm^{-3}$, $8E20$ $cm^{-3}$, $1E21$ $cm^{-3}$, $1.5E21$ $cm^{-3}$, or the like. When the concentration of the phosphorus in the phosphorus-doped polysilicon layer is controlled within the above range, it is conducive to obtaining excellent passivation and metal contact performance. It may be understood that the concentration of the phosphorus in the phosphorus-doped polysilicon layer refers to concentration of the doped element phosphorus in the phosphorus-doped polysilicon layer that only occupies positions of silicon lattices.

When the doped element in the first doped conductive layer 5 is arsenic and the material thereof is polysilicon, the first doped conductive layer 5 is an arsenic-doped polysilicon layer. Concentration of arsenic in the arsenic-doped polysilicon layer ranges from $1E19$ $cm^{-3}$ to $1.5E21$ $cm^{-3}$, which may be, for example, $1E19$ $cm^{-3}$, $5E19$ $cm^{-3}$, $1E20$ $cm^{-3}$, $5E20$ $cm^{-3}$, $8E20$ $cm^{-3}$, $1E21$ $cm^{-3}$, $1.5E21$ $cm^{-3}$, or the like. When the concentration of the arsenic in the arsenic-doped polysilicon layer is controlled within the above range, it is conducive to obtaining excellent passivation and metal contact performance.

When the doped element in the first doped conductive layer 5 is boron and the material thereof is polysilicon, the first doped conductive layer 5 is a boron-doped polysilicon layer. Concentration of boron in the boron-doped polysilicon layer ranges from $1E18$ $cm^{-3}$ to $4.5E19$ $cm^{-3}$, which may be, for example, $1E18$ $cm^{-3}$, $5E18$ $cm^{-3}$, $1E19$ $cm^{-3}$, $2E19$ $cm^{-3}$, $3E19$ $cm^{-3}$, $4E19$ $cm^{-3}$, $4.5E19$ $cm^{-3}$, or the like. When the concentration of the boron in the boron-doped polysilicon layer is controlled within the above range, it is conducive to obtaining excellent passivation performance, and contact with the metal electrode is ensured at the same time.

When the doped element in the first doped conductive layer 5 is gallium and the material thereof is polysilicon, the first doped conductive layer 5 is a gallium-doped polysilicon layer. Concentration of gallium in the gallium-doped polysilicon layer ranges from $1E18$ $cm^{-3}$ to $4.5E19$ $cm^{-3}$, which may be, for example, $1E18$ $cm^{-3}$, $5E18$ $cm^{-3}$, $1E19$ $cm^{-3}$, $2E19$ $cm^{-3}$, $3E19$ $cm^{-3}$, $4E19$ $cm^{-3}$, $4.5E19$ $cm^{-3}$, or the like. When the concentration of the gallium in the gallium-doped polysilicon layer is controlled within the above range, it is conducive to obtaining excellent passivation performance, and contact with the metal electrode is ensured at the same time.

In some embodiments, the thickness of the first doped conductive layer 5 ranges from 20 nm to 150 nm, which may be, for example, 20 nm, 30 nm, 40 nm, 50 nm, 60 nm, 70 nm, 80 nm, 90 nm, 100 nm, 110 nm, 120 nm, 130 nm, 140 nm, 150 nm, or the like.

In some embodiments, the retardation layer 6 in the present disclosure is a film layer structure configured to retard migration of a doped element in the second doped conductive layer 7 to the first doped conductive layer 5 in the metallization region, which can reduce diffusion of the doped element to the tunneling layer 4 in the metallization region, increase doping concentration of the doped element in the second doped conductive layer 7, and then improve the field passivation capability. The material of the retardation layer 6 includes at least one of silicon oxide (e.g., $SiO_x$), silicon carbide (e.g., SiC), silicon nitride (e.g., $SiN_x$), and magnesium fluoride (e.g., $MgF_2$). The diffusion rate of doped ions in the above materials is much lower than the diffusion rate of doped ions in polysilicon. There are many grain boundaries in polysilicon, and the tetrahedral lattice structure of a polysilicon body Si—Si is more suitable for diffusion of impurity atoms than the retardation layer. For example, for the retardation layer, SiC has slow diffusion of impurity elements due to an amorphous state thereof, and $SiO_x$ has slow diffusion of impurity elements due to its own lattice characteristics, so that the impurity elements stay in the retardation layer for a long time and slowly diffuse, thereby playing a retarding role.

The retardation capability of the retardation layer 6 is defined by a longest distance that thermally diffused doped ions can migrate in a direction of the first doped conductive layer towards the tunneling layer. If the longest distance that the doped ions can migrate is shorter, the retardation capability of the retardation layer 6 is stronger. If the longest distance that the doped ions can migrate is longer, the retardation capability of the retardation layer 6 is weaker.

Figure 2:
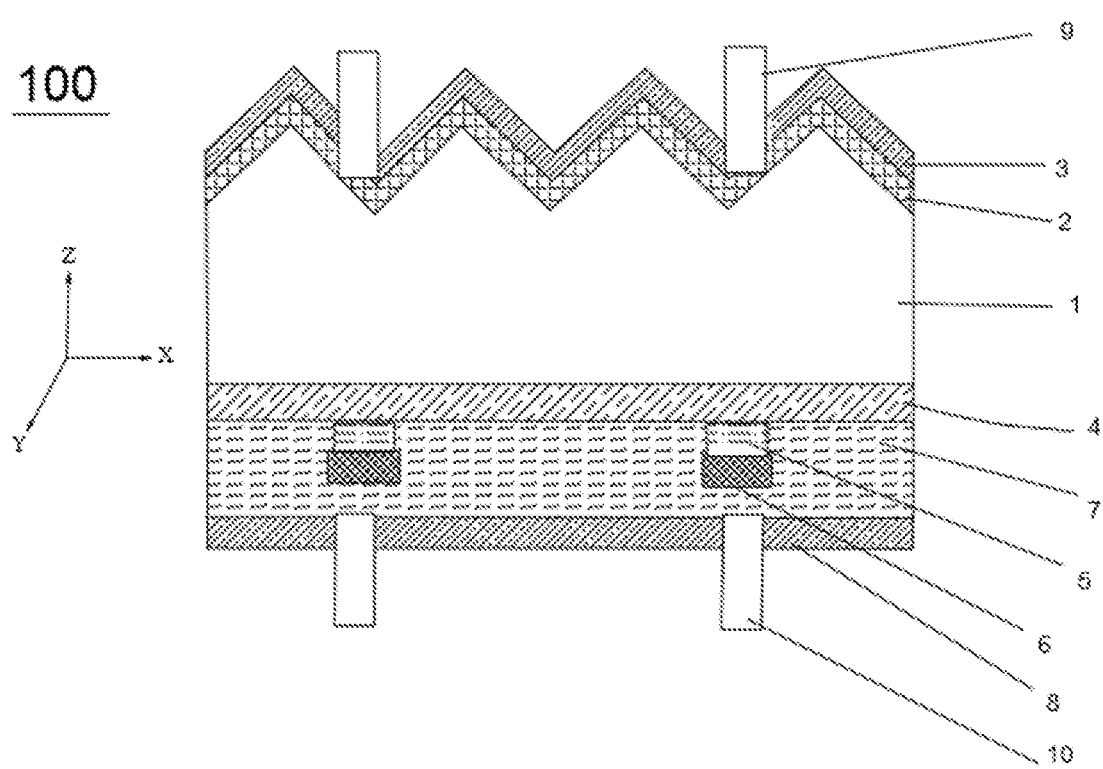
FIG. 2 is a schematic structural diagram of the solar cell according to one or more embodiments of the present disclosure.

In some embodiments, along a direction parallel to the tunneling layer 4, that is, along an X-axis direction in FIG. 1, a ratio of a width of the first doped conductive layer 5 to a width of the retardation layer 6 is in a range of 1:1 to 1:2, which may be, for example, 1:1, 1:1.2, 1:1.5, 1:1.7, 1:2, or the like. For example, the ratio of the width of the first doped conductive layer 5 to the width of the retardation layer 6 is 1:1.2. FIG. 2 is a schematic structural diagram of a solar cell in which the ratio of the width of the first doped conductive layer 5 to the width of the retardation layer 6 is 1:1.2 according to some embodiments of the present disclosure. It may be understood that, in some embodiments, an orthographic projection of the retardation layer 6 on the tunneling layer 4 overlaps with an orthographic projection of the first doped conductive layer 5 on the tunneling layer 4. In some other embodiments, the orthographic projection of the retardation layer 6 on the tunneling layer 4 overlaps partially with the orthographic projection of the first doped conductive layer 5 on the tunneling layer 4. Under the limitation of the above ratio, the doping concentration in the first doped conductive layer 5 can be ensured within a relatively low range, and a passivation effect of the doped element on the tunneling layer 4 can be reduced, which is conducive to increasing the theoretical open-circuit voltage and further improving the conversion efficiency of the solar cell.

In some embodiments, a thickness of the retardation layer 6 ranges from 0.5 nm to 4 nm, which may be, for example, 0.5 nm, 1 nm, 2 nm, 3 nm, 4 nm, or the like. It may be understood that the thickness direction of the retardation layer 6 refers to a direction from the first doped conductive layer 5 to the tunneling layer 4. When the thickness of the retardation layer 6 is controlled within the above range, the doped element in a direction perpendicular to the surface of the tunneling layer 4 can be retarded from entering the first doped conductive layer 5, so that the doping concentration in the first doped conductive layer 5 is lower. If the thickness of the retardation layer 6 is less than 0.5 nm, the retardation ability of the retardation layer 6 is poor, and the first doped conductive layer 5 with lower concentration cannot be obtained. If the thickness of the retardation layer 6 is greater than 4 nm, the retardation layer 6 may greatly retard transport of the carriers in a Z-axis direction, which cannot guarantee effective transport of the carriers.

In some embodiments, the second doped conductive layer 7 covers the tunneling layer 4 in the non-metallization region and the retardation layer 6, and a material of the second doped conductive layer 7 includes semiconductor materials such as polysilicon, microcrystalline silicon, and silicon carbide. A specific type of the second doped conductive layer 7 is not limited in the embodiments of the present disclosure. For example, the material of the second doped conductive layer 7 includes polysilicon.

In some embodiments, a doped element in the second doped conductive layer 7 includes at least one of boron, phosphorus, gallium, and arsenic.

In some embodiments, the doping concentration of the second doped conductive layer 7 ranges from $5E18$ $cm^{-3}$ to $2E21$ $cm^{-3}$, which may be, for example, $5E18$ $cm^{-3}$, $8E18$ $cm^{-3}$, $1E19\ cm^{-3}$, $5E19\ cm^{-3}$, $1E20\ cm^{-3}$, $5E20\ cm^{-3}$, $8E20\ cm^{-3}$, $1E21\ cm^{-3}$, $2E21\ cm^{-3}$, or the like.

When the doped element in the second doped conductive layer 7 is phosphorus and the material thereof is polysilicon, the second doped conductive layer 7 is a phosphorus-doped polysilicon layer. Concentration of phosphorus in the phosphorus-doped polysilicon layer ranges from $5E19\ cm^{-3}$ to $2E21\ cm^{-3}$, which may be, for example, $5E19\ cm^{-3}$, $1E20\ cm^{-3}$, $5E20\ cm^{-3}$, $8E20\ cm^{-3}$, $1E21\ cm^{-3}$, $2E21\ cm^{-3}$, or the like. When the concentration of the phosphorus in the phosphorus-doped polysilicon layer is controlled within the above range, lateral transport of carriers can be ensured, and it is conducive to increasing the fill factor. It may be understood that the concentration of the phosphorus in the phosphorus-doped polysilicon layer refers to concentration of the doped element phosphorus in the phosphorus-doped polysilicon layer that only occupies positions of silicon lattices.

When the doped element in the second doped conductive layer 7 is arsenic and the material thereof is polysilicon, the second doped conductive layer 7 is an arsenic-doped polysilicon layer. Concentration of arsenic in the arsenic-doped polysilicon layer ranges from $5E19\ cm^{-3}$ to $2E21\ cm^{-3}$, which may be, for example, $5E19\ cm^{-3}$, $1E20\ cm^{-3}$, $5E20\ cm^{-3}$, $8E20\ cm^{-3}$, $1E21\ cm^{-3}$, $2E21\ cm^{-3}$, or the like. When the concentration of the arsenic in the arsenic-doped polysilicon layer is controlled within the above range, lateral transport of carriers can be ensured, and it is conducive to increasing the fill factor.

When the doped element in the second doped conductive layer 7 is boron and the material thereof is polysilicon, the second doped conductive layer 7 is a boron-doped polysilicon layer. Concentration of boron in the boron-doped polysilicon layer ranges from $5E18\ cm^{-3}$ to $5E19\ cm^{-3}$, which may be, for example, $5E18\ cm^{-3}$, $1E19\ cm^{-3}$, $2E19\ cm^{-3}$, $3E19\ cm^{-3}$, $4E19\ cm^{-3}$, $5E19\ cm^{-3}$, or the like. When the concentration of the boron in the boron-doped polysilicon layer is controlled within the above range, it is conducive to obtaining excellent passivation performance, and contact with the metal electrode is ensured at the same time.

When the doped element in the second doped conductive layer 7 is gallium and the material thereof is polysilicon, the second doped conductive layer 7 is a gallium-doped polysilicon layer. Concentration of gallium in the gallium-doped polysilicon layer ranges from $5E18\ cm^{-3}$ to $5E19\ cm^{-3}$, which may be, for example, $5E18\ cm^{-3}$, $1E19\ cm^{-3}$, $2E19\ cm^{-3}$, $3E19\ cm^{-3}$, $4E19\ cm^{-3}$, $5E19\ cm^{-3}$, or the like. When the concentration of the gallium in the gallium-doped polysilicon layer is controlled within the above range, it is conducive to obtaining excellent passivation performance, and contact with the metal electrode is ensured at the same time.

In some embodiments, the thickness of the second doped conductive layer 7 ranges from 20 nm to 200 nm, which may be, for example, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, or the like. It may be understood that the first doped conductive layer 5 only corresponds to a local metallization region, the second doped conductive layer 7 covers the first doped conductive layer 5, and the second doped conductive layer 7 corresponds to an entire rear surface of the solar cell (that is, corresponds to the metallization region and the non-metallization region). Therefore, the thickness of the first doped conductive layer 5 is less than the thickness of the second doped conductive layer 7.

In some embodiments, a surface area of the tunneling layer 4 in contact with the first doped conductive layer 5 is denoted as S1, and a sum of the surface area of the tunneling layer 4 in contact with the first doped conductive layer 5 and a surface area of the tunneling layer 4 in contact with the second doped conductive layer 7 is denoted as S2, S1:S2 in a range of 1:5 to 1:50, which may be, for example, 1:5, 1:10, 1:20, 1:30, 1:40, 1:45, 1:50, or the like. Within the above range, lateral transport of the carriers of the doped conductive layer in other regions can be ensured while passivation performance of the doped conductive layer in the metallization region can be ensured, which helps to improve the photoelectric conversion efficiency of the solar cell. If S1:S2 is greater than 1:5, the proportion of the first doped conductive layer 5 is excessively high, resulting in large resistance to the lateral transport of the carriers in the polysilicon layer, an influence on the fill factor of the solar cell, and thus a decrease in the photoelectric conversion efficiency. If S1:S2 is less than 1:50, the proportion of the second doped conductive layer 7 is excessively high, resulting in an increase in a carrier recombination rate in the metallization region, a significant decrease in the passivation effect, an influence on the open-circuit voltage of the solar cell, and thus a decrease in the photoelectric conversion efficiency.

In the present disclosure, the first doped conductive layer with low concentration and the retardation layer are arranged only in the metallization region of the second surface of the solar cell, while the second doped conductive layer with higher concentration is arranged on the entire second surface of the solar cell, so that, on the one hand, the first doped conductive layer with lower concentration is in contact with the tunneling layer, which can reduce the passivation effect of the doped element on the tunneling layer and reduce recombination current density $J_{0,metal}$ in the metallization region, and at the same time, a quasi-Fermi level difference qVD between the first doped conductive layer with lower concentration and the semiconductor substrate is smaller, which is conducive to increasing the theoretical open-circuit voltage and improving photoelectric conversion efficiency of the solar cell. In addition, the second doped conductive layer with higher concentration exists in the metallization region and the non-metallization region, which can ensure lateral transport rates of carriers on a rear surface of the solar cell. Moreover, a distance between the second doped conductive layer in the non-metallization region and the semiconductor substrate is relatively short, which can prevent excessive weakening of an energy band bending effect of the second doped conductive layer caused by an excessive long distance between the second doped conductive layer and the semiconductor substrate due to the arrangement of the first doped conductive layer with low concentration and the retardation layer, thereby ensuring selective transport of the carriers.

One or more embodiments of the present disclosure further provide a method for manufacturing solar cell, which can be used for manufacturing the solar cell provided in the embodiments of the present disclosure. During the manufacturing of the doped conductive layer, a first non-conductive layer 11 covering the tunneling layer 4 is manufactured first, the retardation layer 6 is then manufactured in the metallization region, a second non-conductive layer 12 is manufactured on surfaces of the tunneling layer 4 covering the non-metallization region and the retardation layer 6, and finally doping treatment is performed, so that the second non-conductive layer 12 and the first non-conductive layer 11 that is located in the non-metallization region are transformed into the second doped conductive layer 7 and the first non-conductive layer 11 located in the metallization region is transformed into the first doped conductive layer 5. Due to the existence of the retardation layer 6, as the doping treatment proceeds, resistance of the doped element entering the first non-conductive layer 11 to become the first doped conductive layer 5 becomes greater and greater, so that the doping concentration of the first doped conductive layer 5 decreases sequentially along the direction from the first doped conductive layer 5 to the tunneling layer 4. With the arrangement, the diffusion of the doped element to the tunneling layer 4 can be reduced as much as possible, which is beneficial to improve the passivation performance in the metallization region.

In some embodiments, during the doping treatment, due to the existence of the retardation layer 6 in the metallization region, transport of the doped element towards the first non-conductive layer 11 is prevented, so that more of the doped element exists in the second non-conductive layer 12 located in the metallization region. However, in the non-metallization region, without the blocking by the retardation layer 6, the doped element can diffuse more uniformly throughout the non-metallization region, resulting in existence of fewer of the doped element in the first non-conductive layer 11 located in the non-metallization region and the second non-conductive layer 12. That is, the doping concentration of the second doped conductive layer 7 located in the non-metallization region is greater than the doping concentration of the second doped conductive layer 7 located in the metallization region. With the arrangement, concentration of the region in the second doped conductive layer 7 in contact with the second electrode 10 is relatively high, which is conducive to the lateral transport of the carriers and formation of better contact between the second doped conductive layer 7 and the second electrode 10.

In some embodiments, along a direction parallel to a plane layer where the tunneling layer 4 is located, two sides of the first doped conductive layer 5 are bordered by the second doped conductive layer 7 respectively. Therefore, during the doping treatment, the doped element in the second doped conductive layer 7 may also diffuse into the first doped conductive layer 5 along the direction parallel to the plane layer where the tunneling layer 4 is located, so that the doping concentration of the first doped conductive layer 5 facing the second doped conductive layer 7 is greater than the doping concentration of the first doped conductive layer 5 facing away from the second doped conductive layer 7.

The method for manufacturing solar cell provided in the embodiments of the present disclosure may be used for manufacturing a TOPCon solar cell. The manufacturing processes for the TOPCon solar cell will be clearly and fully described below with reference to the accompanying drawings in the embodiments of the present disclosure, and the described embodiments are merely some of rather than all of the embodiments of the present disclosure.

Figure 3:
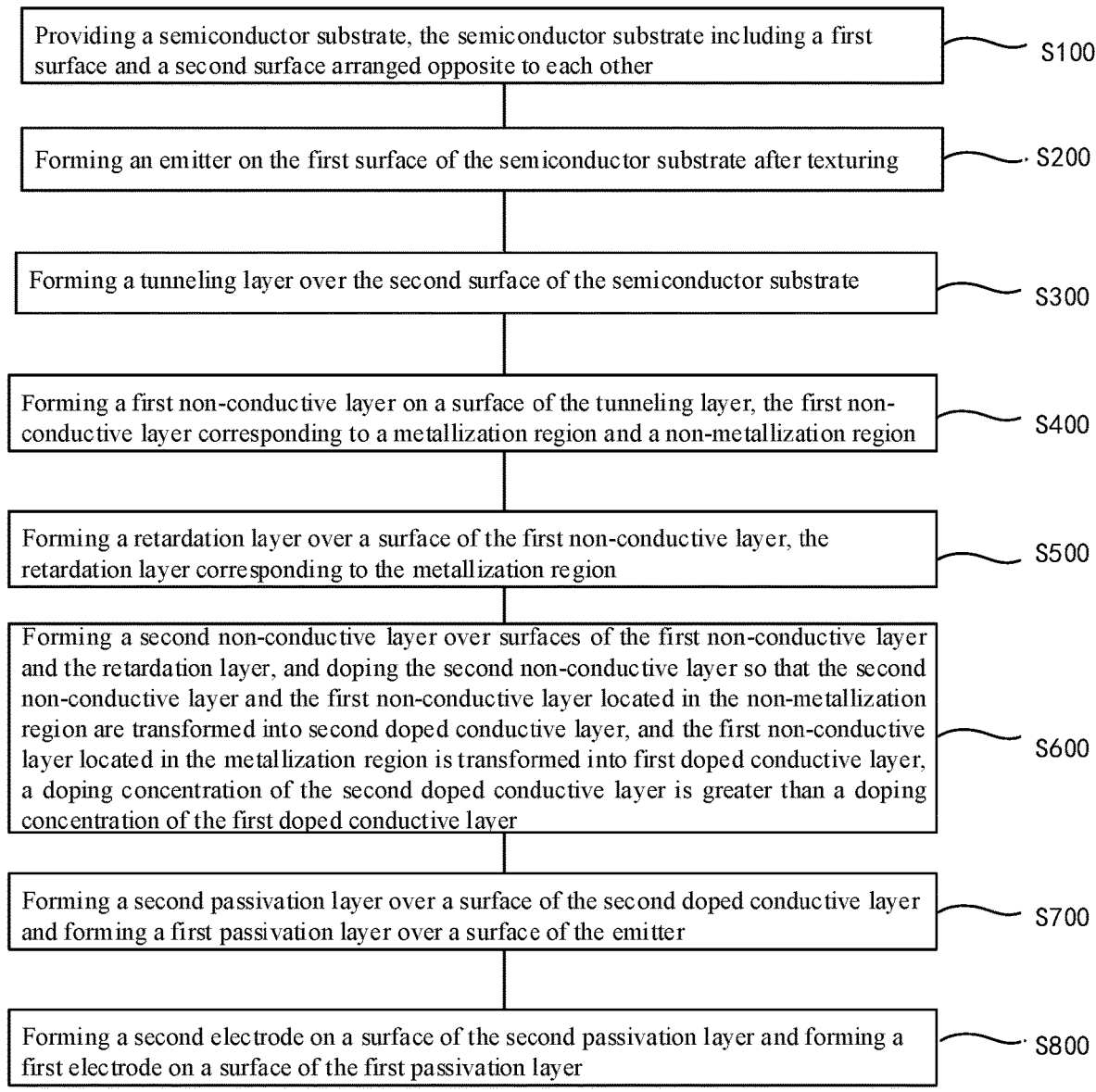
FIG. 3 is a flowchart of manufacturing of the solar cell according to one or more embodiments of the present disclosure.

One or more embodiments of the present disclosure provide a method for manufacturing solar cell. As shown in FIG. 3, the method includes the following steps.

In S100, a semiconductor substrate 1 is provided, the semiconductor substrate 1 including a first surface and a second surface arranged opposite to each other.

In S200, an emitter 2 is formed on the first surface of the semiconductor substrate 1 after texturing.

In S300, a tunneling layer 4 is formed on the second surface of the semiconductor substrate 1.

In S400, a first non-conductive layer 11 is formed on a surface of the tunneling layer 4, and the first non-conductive layer 11 corresponds to a metallization region and a non-metallization region.

In S500, a retardation layer 6 is formed on a surface of the first non-conductive layer 11, and the retardation layer 6 corresponds to the metallization region.

In S600, a second non-conductive layer 12 is formed on surfaces of the first non-conductive layer 11 and the retardation layer 6, and the second non-conductive layer 12 is doped so that the second non-conductive layer 12 and the first non-conductive layer 11 that is located in the non-metallization region are transformed into a second doped conductive layer 7, and the first non-conductive layer 11 located in the metallization region is transformed into a first doped conductive layer 5, doping concentration of the second doped conductive layer 7 is greater than doping concentration of the first doped conductive layer 5.

In S700, a second passivation layer 8 is formed on a surface of the second doped conductive layer 7 and a first passivation layer 3 is formed on a surface of the emitter 2.

In S800, a second electrode 10 is formed on a surface of the second passivation layer 8 and a first electrode 9 is formed on a surface of the first passivation layer 3.

In the present disclosure, the first non-conductive layer 11, the retardation layer 6, and the second non-conductive layer 12 are sequentially formed on the second surface of the semiconductor substrate 1, then doping treatment is performed, and due to the existence of the retardation layer 6, during the doping treatment, fewer of the doped element may enter the first non-conductive layer 11 between the retardation layer 6 and the tunneling layer 4, so that the second non-conductive layer 12 and the first non-conductive layer 11 that is located in the non-metallization region are transformed into the second doped conductive layer 7, and the first non-conductive layer 11 located in the metallization region is transformed into the first doped conductive layer 5, wherein the doping concentration of the second doped conductive layer 7 is greater than the doping concentration of the first doped conductive layer 5. On the one hand, the first doped conductive layer 5 with lower concentration is in contact with the tunneling layer 4, which can reduce the passivation effect of the doped element on the tunneling layer 4, and at the same time, a quasi-Fermi level difference qVD between the first doped conductive layer 5 with lower concentration and the semiconductor substrate 1 is smaller, which is conducive to increasing the theoretical open-circuit voltage and improving photoelectric conversion efficiency of the solar cell. In addition, the second doped conductive layer 7 with higher concentration exists in the metallization region and the non-metallization region, which can ensure lateral transport rates of carriers on the rear surface of the solar cell. Moreover, a distance between the second doped conductive layer 7 in the non-metallization region and the semiconductor substrate 1 is relatively short, which can prevent excessive weakening of an energy band bending effect of the second doped conductive layer 7 caused by an excessive long distance between the second doped conductive layer 7 and the semiconductor substrate 1 due to the arrangement of the first doped conductive layer 5 with low concentration and the retardation layer 6, thereby ensuring selective transport of the carriers.

In some embodiments, the method for manufacturing solar cell is clearly and fully described based on examples in which the first surface of the semiconductor substrate 1 is the front surface of the solar cell and the second surface of the semiconductor substrate 1 is the rear surface of the solar cell.

In S100, a semiconductor substrate 1 is provided, the semiconductor substrate 1 includes a first surface and a second surface arranged opposite to each other.

In some embodiments, the semiconductor substrate 1 is an N-type crystalline silicon substrate (or silicon wafer), or a P-type crystalline silicon substrate (silicon wafer). The crystalline silicon substrate (silicon substrate) is, for example, one of a polycrystalline silicon substrate, a monocrystalline silicon substrate, a microcrystalline silicon substrate, or a silicon carbide substrate. The specific type of the semiconductor substrate 1 is not limited in the embodiments of the present disclosure. A doped element of the semiconductor substrate 1 may be phosphorus, nitrogen, or the like.

In some embodiments, the thickness of the semiconductor substrate 1 ranges from 110 μm to 250 μm. For example, the thickness of the semiconductor substrate 1 may be 110 μm, 120 μm, 140 μm, 150 μm, 160 μm, 170 μm, 180 μm, 190 μm, 200 μm, 210 μm, 220 μm, 230 μm, 240 μm, 250 μm, or the like. The thickness of the semiconductor substrate 1 is not limited in the embodiments of the present disclosure.

Figure 4:
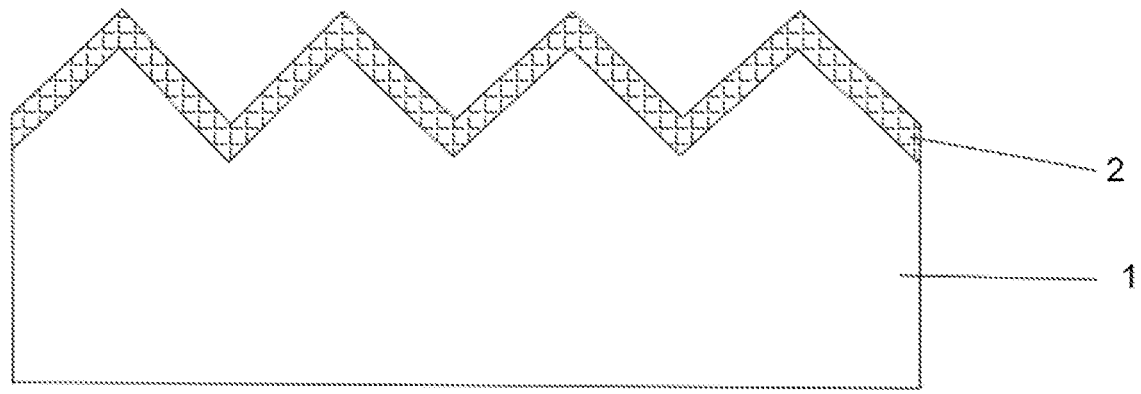
FIG. 4 is a schematic structural diagram of a first emitter formed on a semiconductor substrate according to one or more embodiments of the present disclosure.

In S200, as shown in FIG. 4, an emitter 2 is formed on the first surface of the semiconductor substrate 1 after texturing.

In some embodiments, the front surface of the semiconductor substrate 1 may be textured to form a textured or surface texture structure (e.g., a pyramid structure). The texturing may be, for example, chemical etching, laser etching, a mechanical process, or plasma etching, which is not limited herein. For example, the front surface of the semiconductor substrate 1 may be textured using a NaOH solution. Due to anisotropy of corrosion of the NaOH solution, a pyramid textured structure may be manufactured.

It may be understood that the surface of the semiconductor substrate 1 is textured to have a textured structure, which produces a light trapping effect and increases an amount of light absorbed by the solar cell, so as to improve the conversion efficiency of the solar cell.

In some embodiments, prior to the texturing, a step of cleaning the N-type semiconductor substrate 1 may also be included to remove metal and organic contaminants from the surface.

In some embodiments, the emitter 2 may be formed on the front surface of the semiconductor substrate 1 by any one or more of high-temperature diffusion, paste doping, and ion implantation. For example, the emitter 2 is formed by diffusing boron atoms through a boron source. For example, boron tribromide may be used as the boron source for diffusion, so that a microcrystalline silicon phase of crystalline silicon is transformed into a polycrystalline silicon phase. Due to high concentration of boron on the surface of the semiconductor substrate 1, a layer of borosilicate glass (BSG) may generally be formed. This layer of BSG has a metal impurity absorption effect, which may affect normal operation of the solar cell and is required to be removed later.

In some embodiments, the emitter 2 may have an emitter 2 structure with a uniform doping depth, or have a selective emitter 2 structure with a different doping concentration and a different doping depth.

Figure 5:
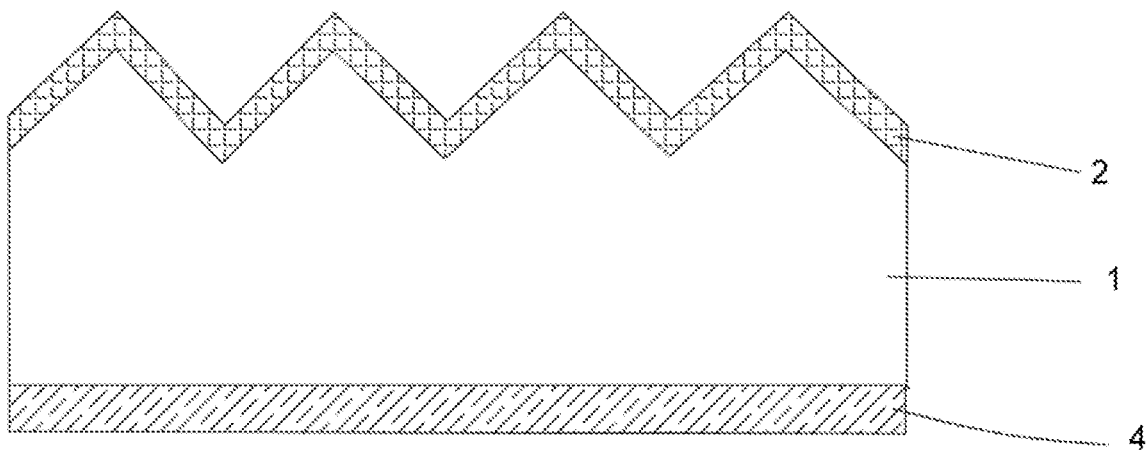
FIG. 5 is a schematic structural diagram of a tunneling layer formed on a second surface of the semiconductor substrate according to one or more embodiments of the present disclosure.

In S300, as shown in FIG. 5, a tunneling layer 4 is formed on the second surface of the semiconductor substrate 1.

In some embodiments, the specific process of forming the tunneling layer 4 is not limited in the embodiments of the present disclosure. For example, the rear surface of the semiconductor substrate 1 may be oxidized by any one of ozone oxidation, high-temperature thermal oxidation, and nitric acid oxidation. The tunneling layer 4 may be one or more of a silicon oxide layer, an aluminum oxide layer, or a silicon oxynitride layer.

Figure 6:
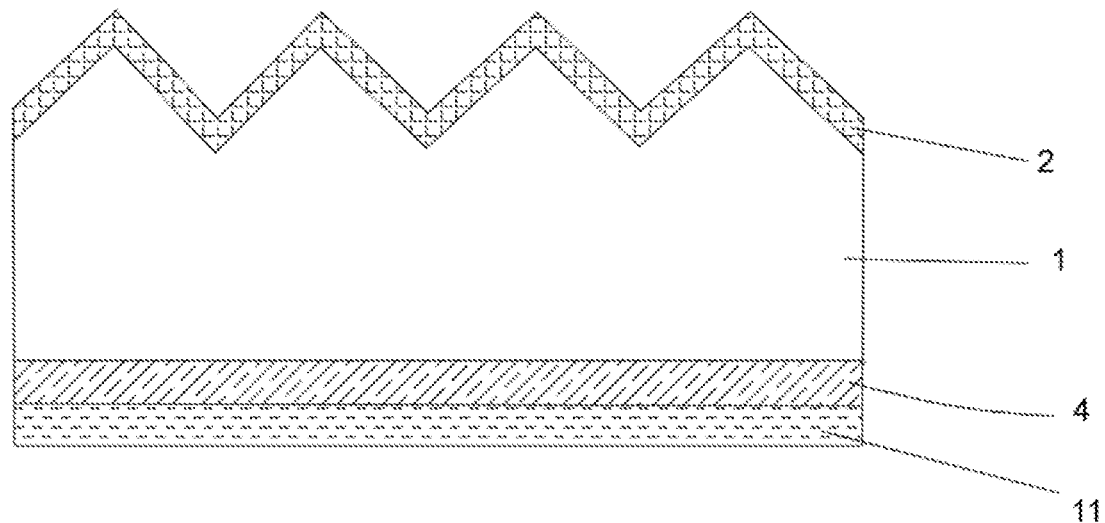
FIG. 6 is a schematic structural diagram of a first non-conductive layer formed on a surface of the tunneling layer according to one or more embodiments of the present disclosure.

In S400, as shown in FIG. 6, a first non-conductive layer 11 is formed on a surface of the tunneling layer 4, and the first non-conductive layer 11 corresponds to a metallization region and a non-metallization region.

In some embodiments, the first non-conductive layer 11 adopts low temperature deposition. For example, an amorphous silicon layer may be manufactured with any one or more methods of chemical vapor deposition (CVD), physical vapor deposition (PVD), and atomic layer deposition (ALD). The manufacturing method for a doped amorphous silicon layer 400 is not limited in the present disclosure. The device for deposition may be a CVD device, a PVD device, an ALD device, or the like.

In some embodiments, a temperature of low temperature deposition ranges from 100° C. to 300° C. The temperature of low temperature deposition may be, for example, 100° C., 110° C., 120° C., 150° C., 170° C., 200° C., 220° C., 250° C., 300° C., or the like. When the temperature of low temperature deposition is limited in the above range, it is conducive to forming a non-conductive film layer, and local non-conductive materials can be crystallized, thereby improving photoelectric performance of the solar cell.

In some embodiments, a thickness of the first non-conductive layer 11 ranges from 20 nm to 150 nm, which may be, for example, 20 nm, 30 nm, 40 nm, 50 nm, 60 nm, 70 nm, 80 nm, 90 nm, 100 nm, 110 nm, 120 nm, 130 nm, 140 nm, 150 nm, or the like.

Figure 7:
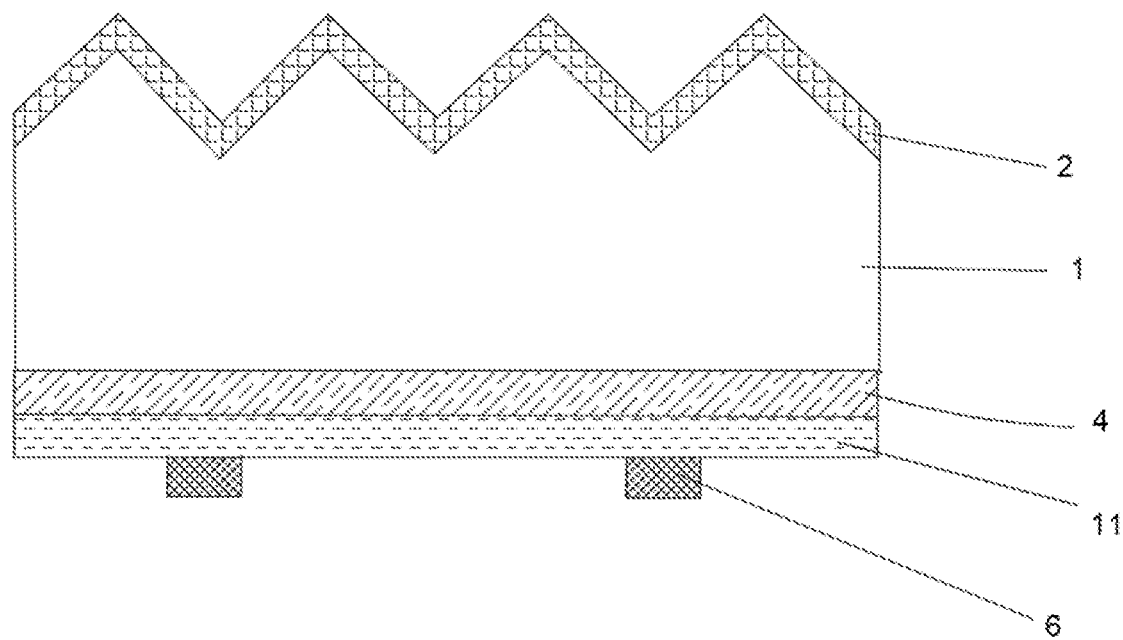
FIG. 7 is a schematic structural diagram of a retardation layer formed on a surface of the first non-conductive layer according to one or more embodiments of the present disclosure.

In S500, as shown in FIG. 7, a retardation layer 6 is formed on a surface of the first non-conductive layer 11, and the retardation layer 6 corresponds to the metallization region.

In some embodiments, in a gas atmosphere of silicon oxide, silicon carbide, silicon nitride, and magnesium fluoride, local laser treatment is performed on the surface of the first non-conductive layer 11 to form the retardation layer 6 corresponding to the metallization region. Upon comparison between local laser treatment and an existing mask treatment method, the local laser treatment process of the present disclosure is simple, with high productivity and easy mass production. It is appreciated that, a localized retardation layer 6 may also be formed in other manners, which is not limited in the present disclosure. During the formation of the retardation layer 6, the retardation layer 6 may be completely located in the metallization region, and part of the retardation layer 6 may be located inside the non-metallization region to obtain a stronger retardation effect.

In some embodiments, laser used in laser treatment has a pulse width ranging from 1 ps to 100 ns, which may be, for example, 1 ps, 100 ps, 500 ps, 1 ns, 5 ns, 10 ns, 50 ns, 100 ns, or the like.

In some embodiments, the laser has a wavelength ranging from 250 nm to 532 nm, which may be, for example, 250 nm, 280 nm, 300 nm, 350 nm, 400 nm, 480 nm, 500 nm, 532 nm, or the like.

In some embodiments, power of laser treatment ranges from 20 $mJ/cm^2$ to 500 $mJ/cm^2$, which may be, for example, 20 $mJ/cm^2$, 50 $mJ/cm^2$, 80 $mJ/cm^2$, 100 $mJ/cm^2$, 150 $mJ/cm^2$, 200 $mJ/cm^2$, 300 $mJ/cm^2$, 400 $mJ/cm^2$, or 500 $mJ/cm^2$. Silicon nitride absorbed well in a blue-green band may be treated with low-power laser. A material with a wide band gap such as silicon oxide is required to be treated with high-power laser.

In some embodiments, a frequency of laser treatment ranges from 100 kHz to 160 kHz, which may be, for example, 100 kHz, 300 kHz, 800 kHz, 1000 kHz, 1300 kHz, or 1600 kHz.

In some embodiments, a number of times of pulse irradiation of laser treatment ranges from 1 to 5 times.

Figure 8:
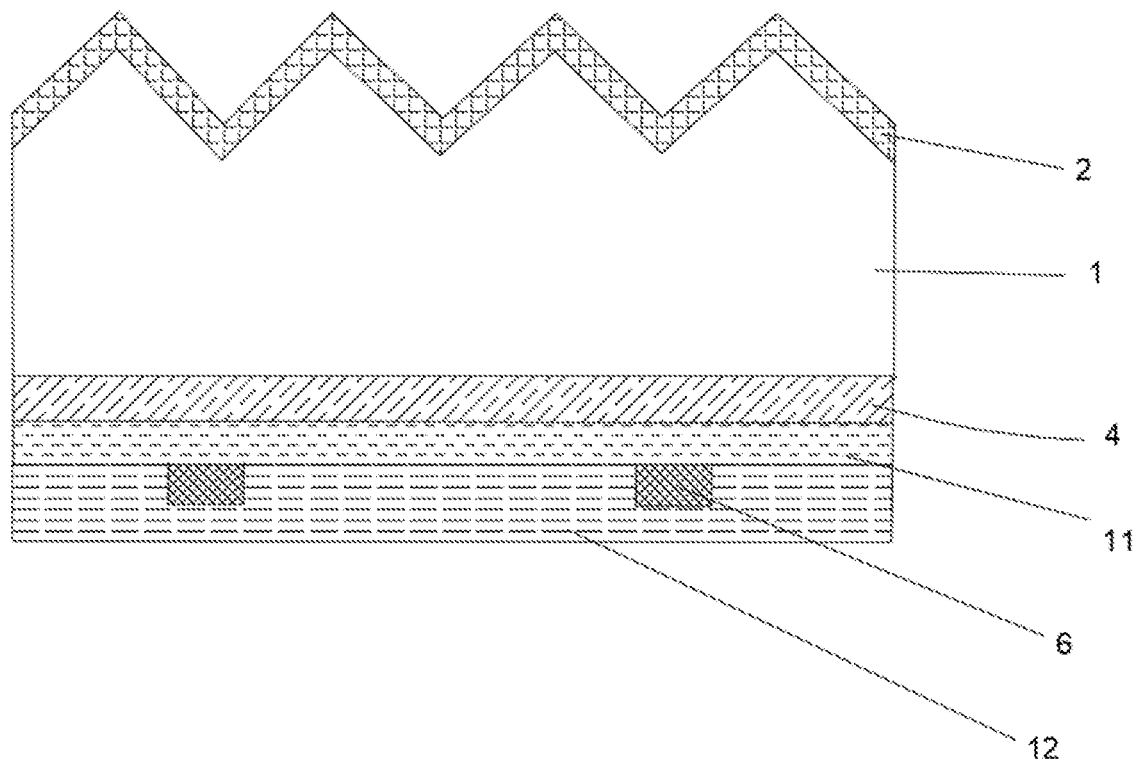
FIG. 8 is a schematic structural diagram of a second non-conductive layer formed on surfaces of the first non-conductive layer and the retardation layer in a non-metallization region according to one or more embodiments of the present disclosure.
Figure 9:
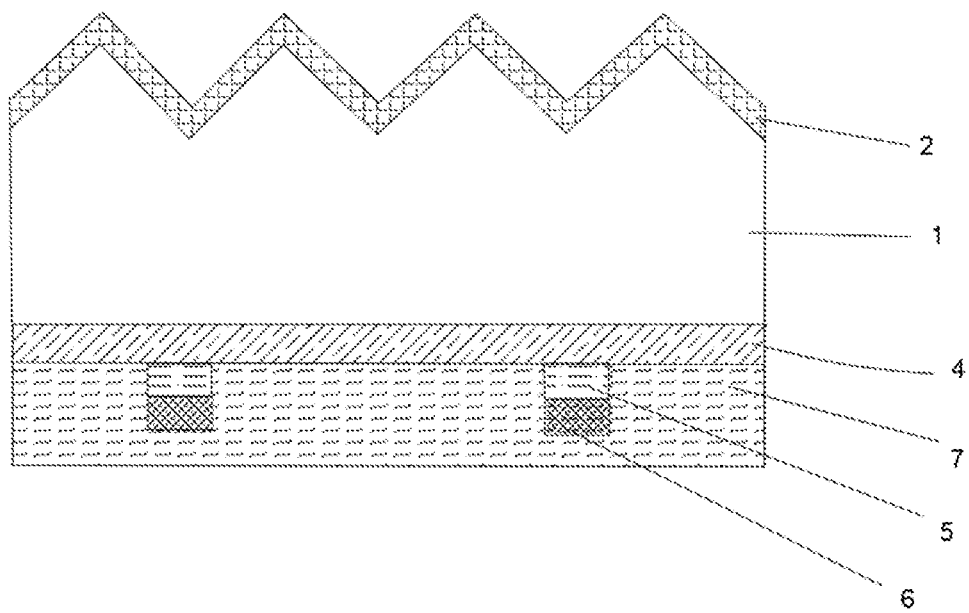
FIG. 9 is a schematic structural diagram after doping treatment of the structure shown in FIG. 8 according to one or more embodiments of the present disclosure.

In S600, a second non-conductive layer 12 is formed on surfaces of the first non-conductive layer 11 and the retardation layer 6, to obtain a structure as shown in FIG. 8, and the second non-conductive layer 12 is doped to obtain a structure as shown in FIG. 9.

During the doping treatment of the second non-conductive layer 12, the doped element diffuses along the Z-axis direction shown in FIG. 1. That is, in the metallization region, the doped element is transported sequentially from the second non-conductive layer 12 to the retardation layer 6 and then to the first non-conductive layer 11. During the transport, due to the existence of the retardation layer 6, it is more difficult for the doped element to diffuse from the second non-conductive layer 12 to the first non-conductive layer 11. Under the pressure of doping, part of the doped element may still diffuse into the first non-conductive layer 11. With the arrangement, the second non-conductive layer 12 and the first non-conductive layer 11 that is located in the non-metallization region are transformed into the second doped conductive layer 7, and the first non-conductive layer 11 located in the metallization region is transformed into the first doped conductive layer 5. The doping concentration of the second doped conductive layer 7 is greater than the doping concentration of the first doped conductive layer 5. It may be understood that the thickness of the first doped conductive layer 5 is the thickness of the first non-conductive layer 11, and the thickness of the second doped conductive layer 7 is the thickness of the first non-conductive layer 11 plus the thickness of the second non-conductive layer 12.

In some embodiments, during the doping treatment, as the doping treatment proceeds, resistance of the doped element entering the first non-conductive layer 11 to become the first doped conductive layer 5 becomes greater and greater, so that the doping concentration of the first doped conductive layer 5 decreases sequentially along the direction from the first doped conductive layer 5 to the tunneling layer 4.

In some embodiments, during the doping treatment, due to the existence of the retardation layer 6 in the metallization region, transport of the doped element towards the first non-conductive layer 11 is prevented, so that more of the doped element exists in second amorphous silicon located in the metallization region. However, in the non-metallization region, without the blocking by the retardation layer 6, the doped element can diffuse more uniformly throughout the non-metallization region, resulting in existence of fewer of the doped element in the first non-conductive layer 11 located in the non-metallization region and the second non-conductive layer 12. That is, the doping concentration of the second doped conductive layer 7 located in the non-metallization region is greater than the doping concentration of the second doped conductive layer 7 located in the metallization region.

In some embodiments, along a direction parallel to a plane layer where the tunneling layer 4 is located, two sides of the first doped conductive layer 5 are bordered by the second doped conductive layer 7 respectively. Therefore, during the doping treatment, the doped element in the second doped conductive layer 7 may also diffuse into the first doped conductive layer 5 along the direction parallel to the plane layer where the tunneling layer 4 is located, so that the doping concentration of the first doped conductive layer 5 facing the second doped conductive layer 7 is greater than the doping concentration of the first doped conductive layer 5 facing away from the second doped conductive layer 7.

In some embodiments, the doping treatment adopts high-temperature deposition diffusion, and the specific manufacturing process thereof includes: introducing nitrogen into a high-temperature device for 20 min, exhausting air in a furnace tube, raising temperature of the high-temperature device to 600° C. to 1100° C., introducing an inert gas mixed with a dopant source, such as Ar/$N_2$, and reacting at a high temperature for 5 min to 50 min; and then introducing oxygen, continuing oxidation reaction at 600° C. to 1100° C. for 5 min to 60 min, and cooling down the high-temperature device to room temperature after oxidation.

In some embodiments, a doped element for the doping treatment includes at least one of boron, gallium, phosphorus, and arsenic. A dopant source for the doping treatment includes at least one of a boron source, a gallium source, a phosphorus source, and an arsenic source. Typically but not restrictively, the boron source may be, for example, at least one of $BCl_3$, $BBr_3$, $B_2H_4$, an organic boron source, and solid silicon containing high-concentration elemental boron, the gallium source may be, for example, trimethylgallium or solid silicon containing a high-concentration gallium element, and the phosphorus source may be, for example, at least one of $POCl_3$, $PH_3$, an organic phosphorus source, and solid silicon containing high-concentration elemental phosphorus. The arsenic source may be, for example, $AsH_3$ or solid silicon containing high-concentration elemental arsenic.

In some embodiments, a conductivity type of the doped element is the same as that of the doped element of the semiconductor substrate 1. For example, if the semiconductor substrate 1 is an N-type substrate, the doped element is an N-type doped element, such as phosphorus or arsenic, and the formed doped layer may be a phosphorus-doped layer or an arsenic-doped silicon layer. If the semiconductor substrate 1 is a P-type substrate, the doped element is a P-type doped element, such as boron or gallium, and the formed doped layer is a boron-doped layer or a gallium-doped layer.

Figure 10:
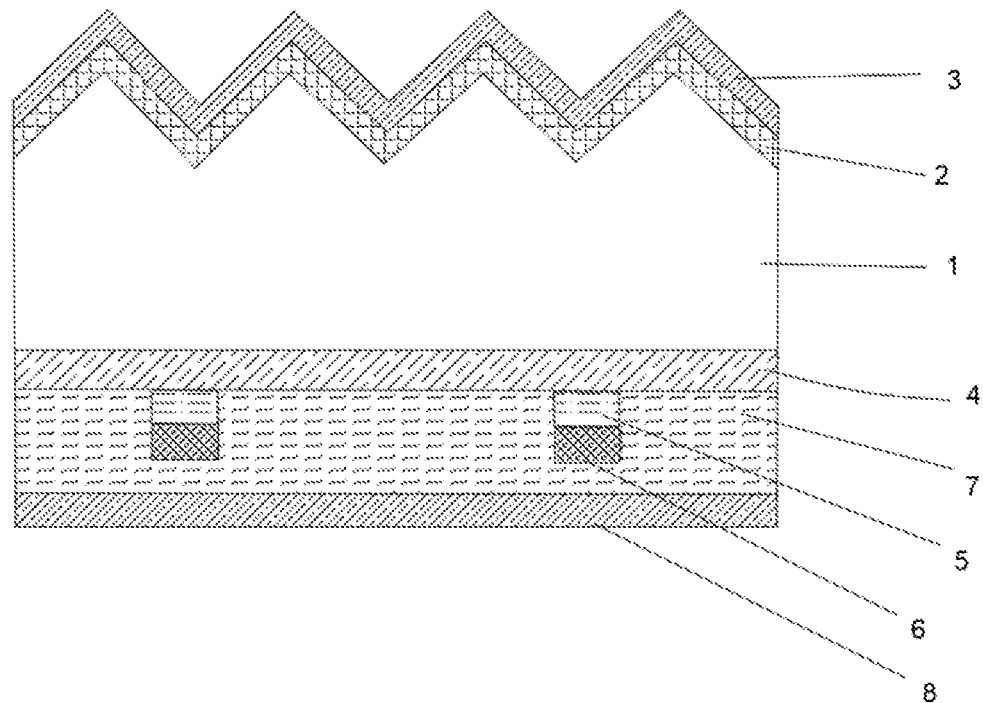
FIG. 10 is a schematic structural diagram after a first passivation layer and a second passivation layer are formed on the semiconductor substrate according to one or more embodiments of the present disclosure.

In S700, as shown in FIG. 10, a second passivation layer 8 is formed on a surface of the second doped conductive layer 7 and a first passivation layer 3 is formed on a surface of the emitter 2.

In some embodiments, the first passivation layer 3 may include, but is not limited to, a single-layer oxide layer or a multi-layer structure such as silicon oxide, silicon nitride, silicon oxynitride, or aluminum oxide. It is appreciated that, the first passivation layer 3 may be other types of passivation layers. The specific material of the first passivation layer 3 is not limited in the present disclosure. The above first passivation layer 3 can produce good passivation and anti-reflection effects on the semiconductor substrate 1, which helps to improve the conversion efficiency of the solar cell.

In some embodiments, the second passivation layer 8 may include, but is not limited to, a single-layer oxide layer or a multi-layer structure such as silicon oxide, silicon nitride, silicon oxynitride, or aluminum oxide. For example, the second passivation layer 8 is made of silicon nitride. A silicon nitride thin-film layer may serve as an anti-reflection film, and the silicon nitride thin film has good insulation, compactness, stability, and a shielding capability for impurity ions. The silicon nitride thin-film layer can perform passivation to the semiconductor substrate 1, and obviously improve the photoelectric conversion efficiency of the solar cell.

In S800, a second electrode 10 is formed on a surface of the second passivation layer 8 and a first electrode 9 is formed on a surface of the first passivation layer 3.

In some embodiments, on the front surface of the semiconductor substrate 1, a front busbar and a front finger are printed with paste and dried to form the corresponding front electrode 9. In some embodiments, on the rear surface of the semiconductor substrate 1, a rear busbar and a rear finger may be printed with paste and dried to form the corresponding second electrode 10. Finally, dried solar cells are sintered to manufacture the solar cell.

Specific materials of the front electrode 9 and the second electrode 10 are not limited in the embodiments of the present disclosure. For example, the front electrode 9 is a silver electrode or a silver/aluminum electrode, and the second electrode 10 is a silver electrode or a silver/aluminum electrode.

In a third aspect, one or more embodiments of the present disclosure provide a photovoltaic module 1000, including at least one solar cell string formed by the solar cells described above through electrical connection.

Figure 11:
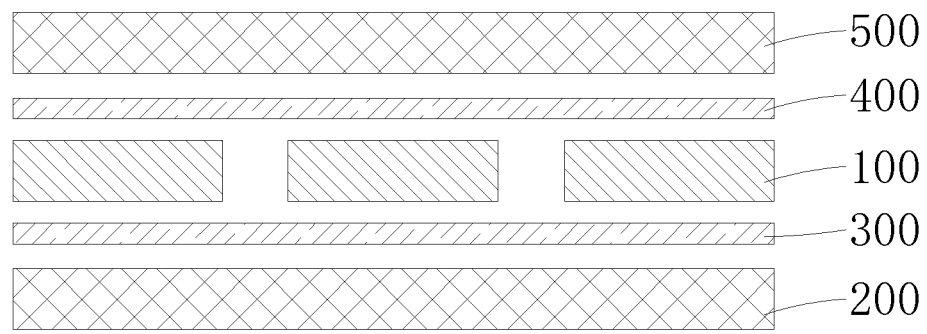
FIG. 11 is a schematic structural diagram of a photovoltaic module according to one or more embodiments of the present disclosure.

As shown FIG. 11, the photovoltaic module 1000 includes a first cover plate 200, a first packaging adhesive layer 300, at least one solar cell string, a second packaging adhesive layer 400, and a second cover plate 500.

In some embodiments, the solar cell string includes a plurality of solar cells 100 as described above that are connected by conductive strips. The solar cells 100 may be connected by partial stacking or by splicing.

In some embodiments, the first cover plate 200 and the second cover plate 500 may be transparent or opaque cover plates, such as glass cover plates or plastic cover plates.

Two sides of the first packaging adhesive layer 300 contact and fit the first cover plate 200 and the solar cell string respectively, and two sides of the second packaging adhesive layer 400 contact and fit the second cover plate 500 and the solar cell string respectively. The first packaging adhesive layer 300 and the second packaging adhesive layer 400 each may be an ethylene-vinyl acetate copolymer (EVA) adhesive film, a polyethylene octene co-elastomer (POE) adhesive film or a polyethylene terephthalate (PET) adhesive film.

Side edges of the photovoltaic module 1000 may also be completely packaged. That is, the side edges of the photovoltaic module 1000 are fully packaged with a packaging adhesive tape to prevent lamination deviation during the lamination of the photovoltaic module 1000.

The photovoltaic module 1000 further includes an edge sealing member. The edge sealing member is fixedly packaged to a partial edge of the photovoltaic module 1000. The edge sealing member may be fixedly packaged to an edge near a corner of the photovoltaic module 1000. The edge sealing member may be a high-temperature resistant tape. The high-temperature resistant tape has excellent high-temperature resistance and may not decompose or fall off during the lamination, which can ensure the reliable packaging of the photovoltaic module 1000. Two ends of the high-temperature resistant tape are fixed to the second cover plate 500 and the first cover plate 200 respectively. The two ends of the high-temperature resistant tape may be bonded to the second cover plate 500 and the first cover plate 200 respectively, and the middle thereof can limit a side edge of the photovoltaic module 1000 to prevent lamination deviation of the photovoltaic module 1000 during the lamination.

The above are merely some embodiments of the present disclosure, and are not intended to limit the present disclosure. Any modification, equivalent replacement, improvement and the like within the spirit and principle of the present disclosure all fall within the protection scope of the present disclosure.

What is claimed is:

1. A solar cell, comprising:
    a semiconductor substrate, the semiconductor substrate including a first surface and a second surface arranged opposite to each other;
    an emitter and a first passivation layer formed over the first surface of the semiconductor substrate;
    a tunneling layer formed over the second surface of the semiconductor substrate;
    a first doped conductive layer and a retardation layer formed on a surface of the tunneling layer, wherein the first doped conductive layer is located between the tunneling layer and the retardation layer, and the first doped conductive layer and the retardation layer correspond to a metallization region;
    a second doped conductive layer formed over the surface of the tunneling layer, the second doped conductive layer covering the tunneling layer in a non-metallization region and the retardation layer, wherein the retardation layer is configured to retard migration of a doped element in the second doped conductive layer to the first doped conductive layer;
    a second passivation layer formed over a surface of the second doped conductive layer; and
    a second electrode penetrating through the second passivation layer to form contact with the second doped conductive layer and a first electrode penetrating through the first passivation layer to form contact with the emitter,
    wherein a doping concentration of the second doped conductive layer is greater than a doping concentration of the first doped conductive layer.

2. The solar cell according to claim 1, wherein a ratio of a width of the first doped conductive layer to a width of the retardation layer is in a range of 1:1 to 1:2.

3. The solar cell according to claim 1, wherein a surface area of the tunneling layer in contact with the first doped conductive layer is denoted as S1, a sum of the surface area of the tunneling layer in contact with the first doped conductive layer and a surface area of the tunneling layer in contact with the second doped conductive layer is denoted as S2, and S1:S2 is in a range of 1:5 to 1:50.

4. The solar cell according to claim 1, wherein a doped element in the first doped conductive layer includes at least one of boron, phosphorus, gallium, or arsenic.

5. The solar cell according to claim 1, wherein a doping concentration of the first doped conductive layer ranges from $1E18$ $cm^{-3}$ to $1.5E21$ $cm^{-3}$.

6. The solar cell according to claim 1, wherein a doping concentration of the first doped conductive layer ranges from $1E18$ $cm^{-3}$ to $4.5E19$ $cm^{-3}$ or from $1E19$ $cm^{-3}$ to $1.5E21$ $cm^{-3}$.

7. The solar cell according to claim 1, wherein a thickness of the first doped conductive layer ranges from 20 nm to 150 nm.

8. The solar cell according to claim 1, wherein a doped element in the second doped conductive layer includes at least one of boron, phosphorus, gallium, or arsenic.

9. The solar cell according to claim 1, wherein a doping concentration of the second doped conductive layer ranges from $5E18$ $cm^{-3}$ to $2E21$ $cm^{-3}$.

10. The solar cell according to claim 1, wherein a doping concentration of the second doped conductive layer ranges from $5E18$ cm$^{-3}$ to $5E19$ cm$^{-3}$ or from $5E19$ cm$^{-3}$ to $2E21$ cm$^{-3}$.

11. The solar cell according to claim 1, wherein a thickness of the second doped conductive layer ranges from 20 nm to 200 nm.

12. The solar cell according to claim 1, wherein a material of the retardation layer includes at least one of silicon oxide, silicon carbide, silicon nitride, or magnesium fluoride.

13. The solar cell according to claim 1, wherein a thickness of the retardation layer ranges from 0.5 nm to 4 nm.

14. The solar cell according to claim 1, wherein a thickness of the first doped conductive layer is less than a thickness of the second doped conductive layer.

15. The solar cell according to claim 1, wherein a doping concentration of the second doped conductive layer in the non-metallization region is greater than a doping concentration of the second doped conductive layer in the metallization region.

16. The solar cell according to claim 1, wherein a doping concentration of the first doped conductive layer decreases along a direction from the first doped conductive layer to the tunneling layer.

17. The solar cell according to claim 1, wherein, along a direction parallel to a plane where the tunneling layer is located, a doping concentration of the first doped conductive layer facing the second doped conductive layer is greater than a doping concentration of the first doped conductive layer away from the second doped conductive layer.

18. A photovoltaic module, comprising:
a cover plate;
a packaging material layer; and
at least one solar cell string, wherein the at least one solar cell string includes a plurality of solar cells and at least one of the plurality of solar cells includes:
a semiconductor substrate, the semiconductor substrate including a first surface and a second surface arranged opposite to each other;
an emitter and a first passivation layer formed over the first surface of the semiconductor substrate;
a tunneling layer formed over the second surface of the semiconductor substrate;
a first doped conductive layer and a retardation layer formed on a surface of the tunneling layer, wherein the first doped conductive layer is located between the tunneling layer and the retardation layer, and the first doped conductive layer and the retardation layer correspond to a metallization region;
a second doped conductive layer formed over the surface of the tunneling layer, the second doped conductive layer covering the tunneling layer in a non-metallization region and the retardation layer, wherein the retardation layer is configured to retard migration of a doped element in the second doped conductive layer to the first doped conductive layer;
a second passivation layer formed over a surface of the second doped conductive layer; and
a second electrode penetrating through the second passivation layer to form contact with the second doped conductive layer and a first electrode penetrating through the first passivation layer to form contact with the emitter,
wherein a doping concentration of the second doped conductive layer is greater than a doping concentration of the first doped conductive layer.

* * * * *